United States Patent
Eisenstadt et al.

(10) Patent No.: US 7,379,716 B2
(45) Date of Patent: May 27, 2008

(54) EMBEDDED IC TEST CIRCUITS AND METHODS

(75) Inventors: William R. Eisenstadt, Gainesville, FL (US); Robert M. Fox, Gainesville, FL (US); Jang Sup Yoon, Gainesville, FL (US); Tao Zhang, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 498 days.

(21) Appl. No.: 11/088,933

(22) Filed: Mar. 24, 2005

(65) Prior Publication Data

US 2006/0217085 A1  Sep. 28, 2006

(51) Int. Cl.
 *H04B 1/04* (2006.01)
(52) U.S. Cl. .................. 455/126; 455/127.2; 455/115.1
(58) Field of Classification Search ................ 455/126, 455/67.11, 67.14, 522, 226.1, 226.2, 69, 115.1, 455/115.2, 423, 424, 127.2, 425
 See application file for complete search history.

(56) References Cited

U.S. PATENT DOCUMENTS

| | | | | |
|---|---|---|---|---|
| 3,736,514 | A * | 5/1973 | Lee .............................. | 327/270 |
| 4,864,639 | A * | 9/1989 | Dapore et al. ............. | 455/226.4 |
| 5,604,728 | A * | 2/1997 | Jylha .......................... | 370/241 |
| 5,742,589 | A * | 4/1998 | Murata ....................... | 370/249 |
| 5,835,850 | A * | 11/1998 | Kumar ...................... | 455/67.14 |
| 5,884,149 | A * | 3/1999 | Jaakola ....................... | 455/103 |
| 6,370,358 | B2 * | 4/2002 | Liimatainen ............. | 455/67.11 |
| 6,418,301 | B1 * | 7/2002 | Le et al. ...................... | 455/73 |
| 6,879,814 | B2 * | 4/2005 | Kaikati et al. ........... | 455/127.1 |
| 6,882,827 | B1 * | 4/2005 | Collier ..................... | 455/67.11 |
| 6,940,263 | B2 * | 9/2005 | Henriksson ............. | 324/76.19 |
| 7,076,201 | B2 * | 7/2006 | Ammar ..................... | 455/3.02 |
| 7,209,722 | B2 * | 4/2007 | Huhtala ................... | 455/226.2 |
| 2004/0198340 | A1 * | 10/2004 | Lee et al. .................... | 455/423 |
| 2005/0143020 | A1 * | 6/2005 | Ren et al. ..................... | 455/83 |
| 2007/0129031 | A1 * | 6/2007 | Newton et al. .......... | 455/127.2 |

OTHER PUBLICATIONS

R.G. Meyer, "Low-power monolithic RF peak detector analysis", IEEE J. Solid-State Circuits, vol. 30, No. 1, pp. 65-67, 1995.
T. Zhang, W.R. Eisenstadt, and R.M. Fox, "A novel 5GHz RF power detector," in Proc. ISCAS, May 2004, vol. 1, pp. 897-900.
Hewlett -Packard Application Note 923, "Schottky barrier diode video detector".

(Continued)

*Primary Examiner*—Blane J. Jackson
(74) *Attorney, Agent, or Firm*—Akerman Senterfitt

(57) ABSTRACT

A self-testing transceiver having an on-chip power detection capability is provided. The self-testing transceiver can include a semiconductor substrate and a transmitter having a high-power amplifier disposed on the substrate. The self-testing transceiver also can include a receiver disposed on the substrate for selectively coupling to an antenna. The self-testing transceiver can further include at least one power detector disposed on the semiconductor substrate for determining a power such as an RMS and/or peak-power of a signal at an internal node of the self-testing transceiver. Additionally, the self-testing transceiver can include a loop-back circuit disposed on the substrate.

10 Claims, 5 Drawing Sheets

OTHER PUBLICATIONS

V. Milanovic, M. Gaitan, E.D. Bowen, N.H. Tea, and M.E. Zagahloul, "Thermoelectric power sensor for microwave applications by commercial CMOS fabrication" IEEE Electron Device Letters, vol. 18, No. 9, Sep. 1997.

Q. Yin, W.R. Eisenstadt, and R.M. Fox, "A translinear-based RF RMS detector for embedded test," in Proc. ISCAS, May 2004, vol. 1, pp. 245-248.

* cited by examiner

EMBEDDED IC TEST CIRCUITS AND METHODS

BACKGROUND

1. Field of the Invention

The present invention is related to the field of electronic circuit testing, and, more particularly, embedded testing of electronic circuits.

2. Description of the Related Art

Electronic circuit designers face a seemingly relentless demand for new electronic devices that can provide increasingly sophisticated capabilities and offer ever greater bandwidth operability. This demand is reflected in the drive to integrate various digital and analog components in smaller areas, using fewer chips. Indeed, a frequently-cited goal is to create an integrated system on a single chip, a so-called "system-on-a-chip" (SoC) in which a small crystal of silicon or other semiconductor material would be fabricated to carry out each of the various electronic functions of an entire system. Aided by advances in processing technologies, electronic circuit designers are moving ever closer to this goal by increasingly integrating various digital and analog components. The result is an ever increasing array of chips that integrate varied mixed-signal circuits, including integrated RF and microwave circuits.

As chips become more complex—integrating, for example, mixed-signal/RF circuits—the need for more accurate testing of such circuits is likely to increase. This is largely due to the fact that in most instances the expenses associated with complex testing equipment and time lost in testing are among the more significant factors contributing to the costs of designing and manufacturing new, ever more complex integrated circuits (ICs). Accordingly, if costs are to be constrained in the face of unabated demand for more complexity and more integration, there will necessarily need to be better techniques for testing mixed-signal ICs.

SUMMARY OF THE INVENTION

The present invention provides for embedded or on-chip self-testing of electronic circuits. A self-testing transceiver having an on-chip power detection capability is provided according to one embodiment. The self-testing transceiver can include a semiconductor substrate on which a transmitter comprising a high-power amplifier is disposed. A receiver can also be disposed on the substrate for selectively coupling to an antenna through which wireless signals can be transmitted and received. The self-testing transceiver additionally can include a loop-back circuit providing a path for a test signal to effect self testing by the transceiver. The self-testing transceiver can further include at least one power detector disposed on the semiconductor substrate for determining a power such as an RMS and/or peak-power of a signal at an internal node of the self-testing transceiver.

Another embodiment of the present invention provides an on-chip loopback circuit operable at frequencies of at least 100 MHz for testing a transmitter, receiver, or transceiver. The loopback circuit can include a signal attenuator disposed on a semiconductor substrate. The loopback circuit additionally can include a first switch disposed on the semiconductor for switching a transmitter preamplifier between the attenuator and a high-power amplifier. The loopback circuit further can include a second switch disposed on the semiconductor for switching a low-noise amplifier between the attenuator and an antenna. In a self-testing mode the first switch connects the attenuator to the preamplifier and the second switch connects the attenuator to the low-noise amplifier to provide a signal path for a test signal from the preamplifier to the low-noise amplifier through the attenuator.

Still another embodiment provides a power detector. The detector can include an initial-stage attenuator for attenuating a received signal, the initial-stage attenuator having a signal input and a signal output, and a final-stage attenuator electrically connected to the initial-stage attenuator for also attenuating the received signal, the final-stage attenuator also having a signal input and a signal output. The detector further can include at least one intermediate-stage attenuator connected in series between the initial-stage attenuator and the final-stage attenuator for also attenuating the received signal.

Additionally, the detector can include an initial-stage detection unit connected to the signal input of the initial-stage attenuator for providing a first power measurement, an intermediate-stage detection unit connected to the signal output of the initial-stage attenuator for providing a second power measurement, at least one additional intermediate-stage detection unit connected to the signal input of the final-stage attenuator for providing a third power measurement, and a final-stage detection unit connected to the signal output of the final-stage attenuator.

The detector can further include a determining module connected to each of the detection units for determining a power measurement of the received signal. According to one embodiment, the determining module can determine a power measurement by selecting one of a ratio of the second power measurement to the first power measurement, a ratio of the third power measurement to the second power measurement, and a ratio of the fourth power measurement to the third power measurement.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
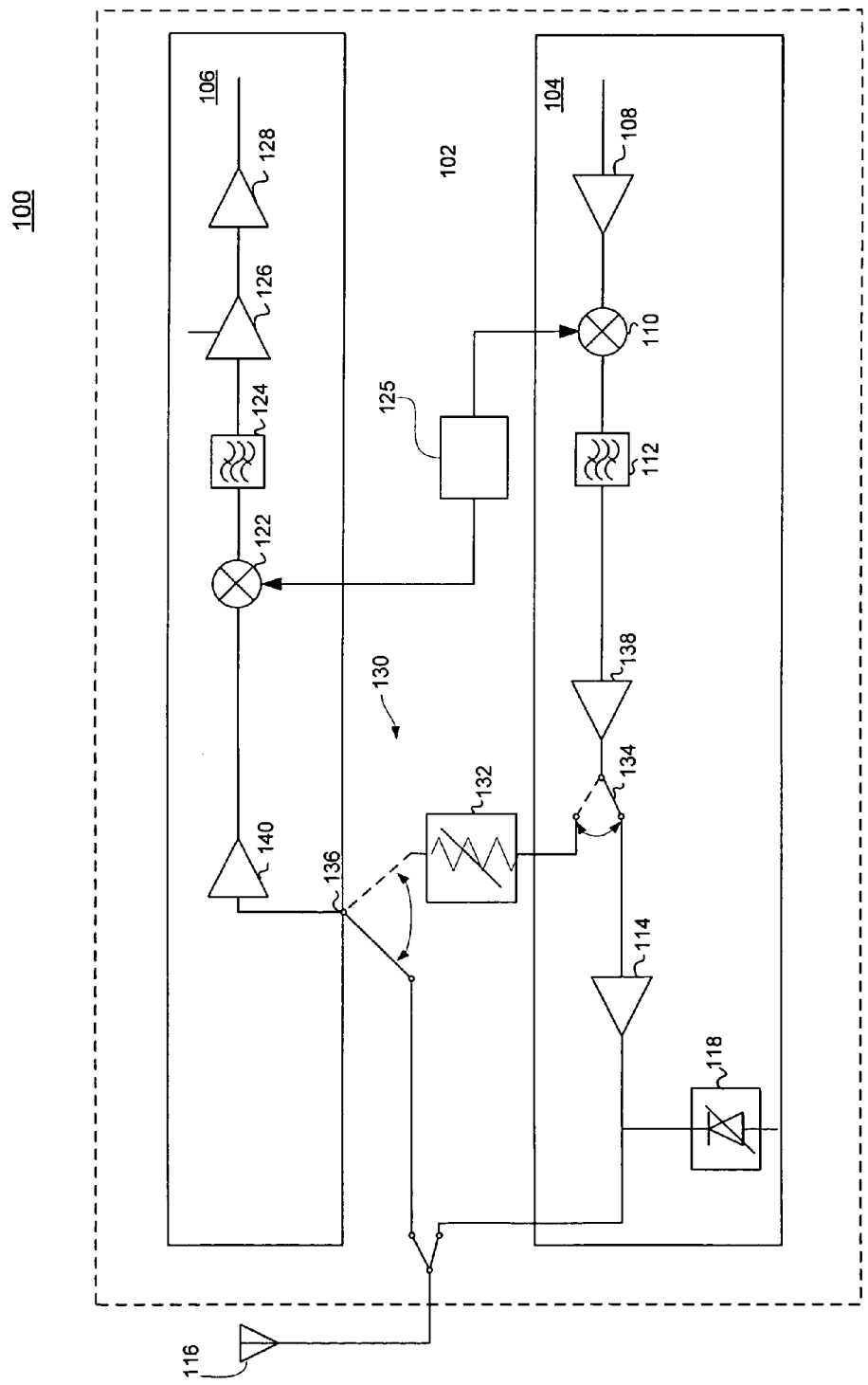
FIG. 1 is a schematic diagram of a transceiver having an on-chip power detection capability and including a loop-back circuit, according to one embodiment of the present invention.

FIG. 1 provides a schematic diagram of a self-testing transceiver 100, according to one embodiment of the invention. The self-testing transceiver 100 has an on-chip power detection capability, and, as illustrated, comprises a substrate 102 on which a transmitter 104 and a receiver 106 are disposed. The transmitter 104 illustratively includes an amplifier 108, a first mixer 110 connected to the amplifier, and a first filter 112 connected to the first mixer. As further illustrated, the transmitter 104 also includes a high-power amplifier 114 that electrically connects to an antenna 116 for effecting wireless signal transmissions. The transmitter 104 also illustratively includes a detector 118, which as shown is electrically coupled to the high-power amplifier 114.

The receiver 106 illustratively includes a second mixer 122 and a second filter 124 connected to the second mixer. Illustratively, a synthesizer 125 is connected between the first mixer 110 and the second mixer 122 for synchronizing the two mixers. Signals that pass through the second filter 124 are amplified by a series of additional amplifiers 126, 128, which can include, for example, an automatic gain control amplifier.

The self-testing transceiver 100 further includes an on-chip loopback circuit 130, which illustratively extends between the transmitter 104 and the receiver 106. The loopback circuit 130 illustratively includes an attenuator 132, a first switch 134 that selectively connects to the attenuator, a second switch 136 that selectively connects to the attenuator, a preamplifier 138 connected to the first switch, and a low-noise amplifier 140 connected to the second switch. The attenuator 132, more particularly, is a high-frequency attenuator, which operates at approximately 100 MHz or above. Illustratively, the first switch 134 is interposed between the high-power amplifier 114 and the preamplifier 138 for switching the preamplifier between the high-power amplifier and the attenuator 132. The second switch 136 is illustratively interposed between the low-noise amplifier 140 and the attenuator 132 for switching the low-noise amplifier 140 between the attenuator and the antenna 116.

Operationally, the self-testing transceiver 100 effects the testing of its various internal components by amplifying one or more test signals through the preamplifier 138 and conveying the signals via the loopback circuit 130 to the low-noise amplifier 140. Accordingly, in a self-testing mode, the first switch 134 connects the preamplifier 138 to the attenuator 132, and the second switch 136 connects the attenuator to the low-noise amplifier 140, thereby providing a signal path for a test signal from the preamplifier to the low-noise amplifier through the attenuator. In a normal operating mode, the first switch 134 connects the preamplifier 138 to the high-power amplifier 114, and the second switch 136 connects the low-noise amplifier 140 to the antenna 116.

It should be noted that the loopback circuit 130 described herein provides advantages not offered with conventional radio frequency (RF) and intermediate frequency (IF) testing devices and techniques. As will be readily appreciated by one of ordinary skill in the art, conventional devices and techniques typically are constrained to design-stage and production-stage testing, during which testing of the transmitting and receiving blocks of a transceiver are generally performed separately. The heretofore seemingly insurmountable obstacles to embedded or on-chip testing included potential signal path mismatch, crosstalk, and signal leakage problems known to adversely affect RF and IF circuits. Relatedly, the surface area requirements for components that heretofore had been thought necessary to confront these obstacles were largely prohibitive.

By contrast, the loopback circuit 130 of the present invention, in providing the attenuator 132 disposed on the substrate 102 between the transmitter 104 and the receiver 106 overcomes these obstacles. The attenuator 132, which, as already noted, is a high-frequency attenuator, attenuates RF and IF signals that would otherwise preclude embedded testing. Specifically, the attenuator 132 provides a signal that is attenuated by at least 40 dB so as to be utilized effectively and efficiently by the low-noise amplifier 140. Thus it is that the present invention is able to overcome obstacles that had prevented embedded or on-chip testing of both the transmitter 104 and the receiver 106. An added benefit is that the loopback circuit 130 provided by the present invention obviates the need for more costly and/or more complex testing components and procedures.

The attenuator 132 of the loopback circuit 130, more particularly, can be any one of a variety of attenuator types currently available, such a metal-oxide semiconductor (MOS) attenuator, integrated PIN diode, or resistance attenuator. More preferably, the attenuator 132 is a resistance attenuator. Implementing the attenuator 132 as a resistance attenuator provides several advantageous. A primary advantage is that the resistance attenuator is able to provide wideband circuit operability and allows for compact implementation. The attenuator 132 can be, for example, a resistance attenuator of a π-type. Alternatively, the attenuator 132 can be a resistance attenuator of a T-type. Moreover, each of the π-type and the T-type resistance attenuators can be implemented using three on-chip resistors for two-port networks.

Figure 2:
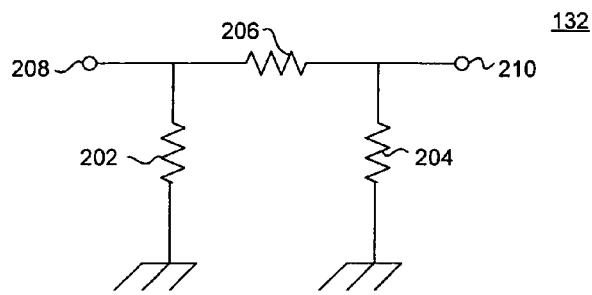
FIG. 2 is a schematic diagram of an attenuator used in a transceiver having an on-chip power detection capability and including a loop-back circuit, according to another embodiment of the present invention.

Referring additionally now to FIG. 2, the attenuator 132 implemented as a resistance attenuator of a π-type is illustrated. As shown, the π-type resistance attenuator comprises a first resistor 202 and a second resistor 204, each of which is connected to ground. A third resistor 206 is connected between two ports 208, 210 and each of the other resistors. If $Z_0$ represents impedance at the first port 206, and if $\alpha$ represents the desired attenuation in decibels (dB), then the resistance of the third resistor 206 can be determined from the following equation, where $R_3$ is the resistance in ohms of the third resistor:

$$R_3 = \frac{Z_0}{2}(10^{\alpha/10} - 1)10^{\alpha/20}.$$

The resistance in ohms of the first resistor 202 equals that of the second resistor 204, the value of which is determined from the following equation, where $R_1$ and $R_2$ are the resistances of the respective resistors:

$$R_1 = R_2 = \frac{1}{\frac{10^{\alpha/10}+1}{Z_0(10^{\alpha/10}-1)} - \frac{1}{R_3}}.$$

Figure 3:
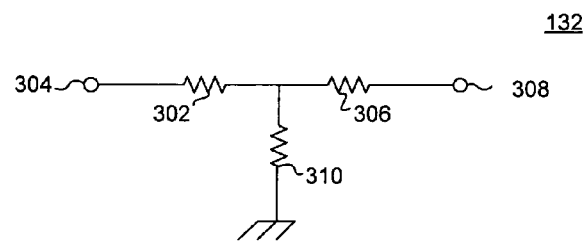
FIG. 3 is a schematic diagram of an attenuator for use in a transceiver having an on-chip power detection capability and including a loop-back circuit, according to yet another embodiment of the present invention.

Referring also now to FIG. 3, the attenuator 132 implemented, alternatively, as a T-type resistance attenuator is shown. As illustrated, the attenuator 132 implemented as a T-type resistance attenuator comprises a first resistor 302 connected to a first port 304, a second resistor 306 connected to a second port 308, and a third resistor 310 connected to ground between the first and second resistors. Again, if $Z_0$ represents impedance at the first port 304, and if α represents the desired attenuation in decibels (dB), then the resistance of the third resistor 310 can be determined from the following equation, where $R_3$ is the resistance in ohms of the third resistor:

$$R_3 = \frac{2Z_0 10^{\alpha/20}}{10^{\alpha/10}-1}.$$

Similarly, the resistance in ohms of the first resistor 302 again equals the resistance of the second resistor 306, and the value of the equal resistances can be determined from the following equation where $R_1$ and $R_2$ are the resistances of the respective resistors:

$$R_1 = R_2 = \frac{10^{\alpha/10}+1}{(10^{\alpha/10}-1)}Z_0 - R_3.$$

The inventors have found that for an attenuation of up to 30 dB, the attenuator 132 can be implemented in a chip using either the π-type or T-type resistance attenuator. For an attenuation in excess of 40 dB, however, the π-type resistance attenuator yields the better performance. For high attenuations with the T-type resistance attenuator, moreover, the inventors have found that the resistance of the third resistor 310 should be no more than one ohm for adequate performance. Better performance is achieved, moreover, if the resistors are fabricated from the same physical material.

Another key feature of the loopback circuit 130 of the present invention is the first switch 134 and the second switch 136. Although, each can be implemented as different types of switches, preferably, each is implemented as an RF/microwave switch. Implemented as an RF/microwave switch, either or both the first switch 134 and the second switch 136 can comprise one of a variety of RF/microwave switches, including a complementary metal-oxide semiconductor (CMOS) RF/microwave switch, a gallium arsenide (GaAs) RF/microwave switch, and a micro-electromechanical (MEM) RF/microwave switch.

The loopback circuit 130, as described, provides the appropriate signal path for effecting self-testing with one or more test signals emitted by the self-testing transceiver 100. It is the role of the detector 118, then, to detect the test signals. Signal detectors can be positioned at various internal nodes of the transmitter 104 and/or receiver 106 to detect signal responses to one or more test signals at the various nodes. The detector 118 that is illustratively connected to the high-pass amplifier 114 is but an exemplary detector, illustrating the detectors that can be variously positioned in or on the self-testing transceiver 100. Accordingly, it is to be understood that various detectors can likewise be positioned elsewhere in or on the self-testing transceiver 100.

Figure 4:
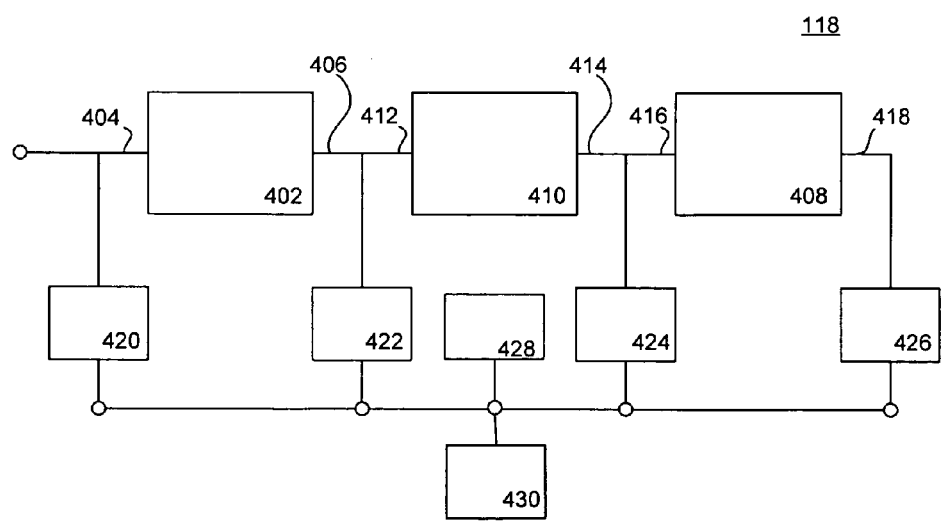
FIG. 4 is a schematic diagram of a power detector, according to a different embodiment of the present invention.

According to another embodiment, the detector 118 is specifically implemented as a power detector for detecting power over an extended dynamic range. Implemented as a power detector, more particularly, the detector 118 can detect power, such as root-mean-square (RMS) power and/or peak-power. Referring additionally now to FIG. 4, the power detector illustratively includes a plurality of attenuators and a plurality of detection units. The plurality of attenuators, more particularly, includes an initial-stage attenuator 402 having a signal input 404 and a signal output 406. The plurality of attenuators further includes a final-stage attenuator 408 and an intermediate-stage attenuator 410 connected in series between the final-stage and initial-stage attenuators. The intermediate-stage attenuator 410 has a signal input 412 and signal output 414. Likewise, the final-stage attenuator 408 has a signal input 416 and signal output 418.

As further illustrated, an initial-stage detection unit 420 is connected at the signal input 404 of the initial-stage attenuator 402 for providing a first power measurement. An intermediate-stage detection unit 422 is connected to the signal output 406 of the initial-stage attenuator 402 for providing a second power measurement, and an additional intermediate-stage detection unit 424 is connected to the signal input 416 of the final-stage attenuator 418 for providing a third power measurement. A final-stage detection unit 426 is connected to the signal output 418 of the final-stage attenuator 408. A reference unit 428 is connected to each of the detection units 420, 422, 424, 426. Additionally, a power determining module 430 receives the measurements of each of the detection units for determining a measurement of the power of the received signal, as explained below. As noted above, the power measurement can include at least one of an RMS and a peak-power measurement.

The initial-stage attenuator 402 and the intermediate-stage attenuator 410, more particularly, can both be implemented as resistance attenuators of the π-type described above. The final-stage attenuator 408 can be implemented as an L-type attenuator comprising a first input port, a first resistor connected thereto, a second resistor in series with the first, the end connected to ground, and an output port between the first and second resistors. The final-stage attenuator 408 alternatively can be implemented as a π-type attenuator, as described above.

The dynamic range achieved using conventional devices for measuring RMS power has thus far proved insufficient for embedded or on-chip testing of RF and IF devices. The limitations stem at least in part from the fact that conventional power detectors tend to exhibit a limited dynamic range, being generally suited only for detecting RMS power below approximately 40 millivolts (mV). Another problem stems from the fact that wideband constant-gain amplifiers are typically unavailable in Giga-Hertz frequency ranges. With the present invention, the cascaded attenuators provided by the detector 118 illustrated in FIG. 4 overcome these limitations. Specifically, when implemented as power detector for detecting RMS power, for example, the detector 118 provides a cascade of attenuators that extend the dynamic range of power detectors able to test RMS power in the small-signal-detection region.

Figure 5:
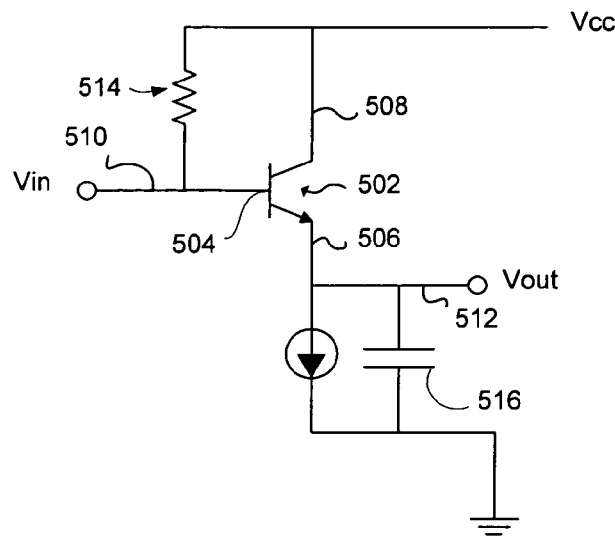
FIG. 5 is a schematic diagram of a BJT detection unit for use in a power detector, according to still another embodiment of the present invention.
Figure 6:
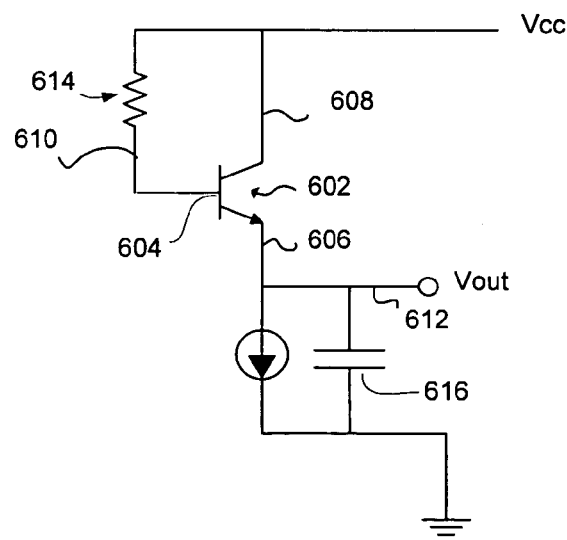
FIG. 6 is a schematic diagram of a BJT reference unit for use in a power detector, according to yet another embodiment of the present invention.

Power detection, according to this embodiment, is provided by the initial-stage detection unit 420, intermediate-stage detection unit 422, additional intermediate-stage detection unit 424, and final-stage detection unit 426. A reference unit 428 is connected to the detection units 420-426 so as to provide a reference voltage or current to the detector 118 implemented as a power detector. Each detection unit 420, 422, 424, 426, according to one embodiment of the present invention, can be implemented as a bipolar junction transistor (BJT) detection unit 500 as illustrated in FIG. 5.

Illustratively, each BJT detection unit 500 comprises a bipolar junction transistor 502 having a base region 504, an emitter region 506, and a collector region 508. The BJT detection unit 500 further can include a signal input 510 electrically connected at the base region 504 of the bipolar junction transistor 502, and a signal output 512 electrically connected to the emitter region 506 of the bipolar junction transistor 502. As also illustrated, a resistor 514 can be connected between the collector region 508 and the base region 504 of the bipolar junction transistor 502. A capacitor 516 additionally can be connected between the signal output 510 and the collector region 508 of the bipolar junction transistor 502.

As already noted the reference unit 428 similarly can be implemented as a BJT reference unit 600. The BJT reference unit 600 comprises a bipolar junction transistor 602 having a base region 604, an emitter region 606, and a collector region 608. The BJT reference unit 600 includes a signal output 612 electrically connected to the emitter region 606 of the bipolar junction transistor 602. As also illustrated, a resistor 614 can be connected between the collector region 608 and the base region 604 of the bipolar junction transistor 602. A capacitor 616 additionally can be connected between ground and the signal output 612 of the bipolar junction transistor 602.

For a given signal input received by the detector 118 implemented as a power detector, the signal is attenuated by a given amount by each of the attenuators 402, 408, 410. The detection units 420-426 jointly and cooperatively provide a dynamic range of detecting in the sense that each detects a signal level in an operable range different than that of the others. Owning to the extended nature of the dynamic range, not all of the power detection units 420, 422, 424, 426 will be performing within their individual operable ranges at particular frequencies in the range. Nonetheless, the cascade arrangement of the attenuators—the initial-stage attenuator 402, intermediate-stage attenuator 410, and final-stage attenuator 408—successively diminishes the level of the signal at each succeeding output so that at least one output will be within an operable range of the detection units. When a pair of detection units connected respectively to the input and the output of a particular attenuator are both functioning within their operable ranges, the ratio of their output voltages should be equal to the gain of the particular attenuator positioned between the detection units.

If the four successive DC outputs received by the four distinct detection units are $V_1$, $V_2$, $V_3$, and $V_4$, respectively, then there are three ratios—$V_2/V_1$, $V_3/V_2$, and $V_4/V_3$—to consider in determining which detection units are functioning within their correct operable ranges. Of the three ratios, the one that most closely approximates the gain of the corresponding attenuator indicates the detection units that likely provide the best estimate of, for instance, RMS power of the received signal. Thus, according to one embodiment of the present invention, the power determining module 430 determines a measurement of the power of the received signal by selecting one of the ratio of the second power measurement to the first power measurement, the ratio of the third power measurement to the second power measurement, and the ratio of the fourth power measurement to the third power measurement.

Illustratively, the detector 118 implemented as a power detector illustratively includes one intermediate-stage attenuator. It is to be understood, however, that in other embodiments more than one intermediate-stage attenuator can be positioned between the initial-stage attenuator 422 and the final stage attenuator 426. With a single intermediate-stage attenuator, each of the initial-stage attenuator 422, intermediate-stage attenuator 424, and the final stage attenuator 426 can effect, for example, a −8 dB attenuation each. In other embodiments, however, the respective attenuations of each of the distinct attenuators can be unique and can yield attenuations either greater than or less than a −8 dB attenuation. Moreover, consistent with the description herein, the inclusion of more than one intermediate-stage attenuator can yield even finer gradations within the extended dynamic range provided by the cascading of the multiple attenuators.

Figure 7:
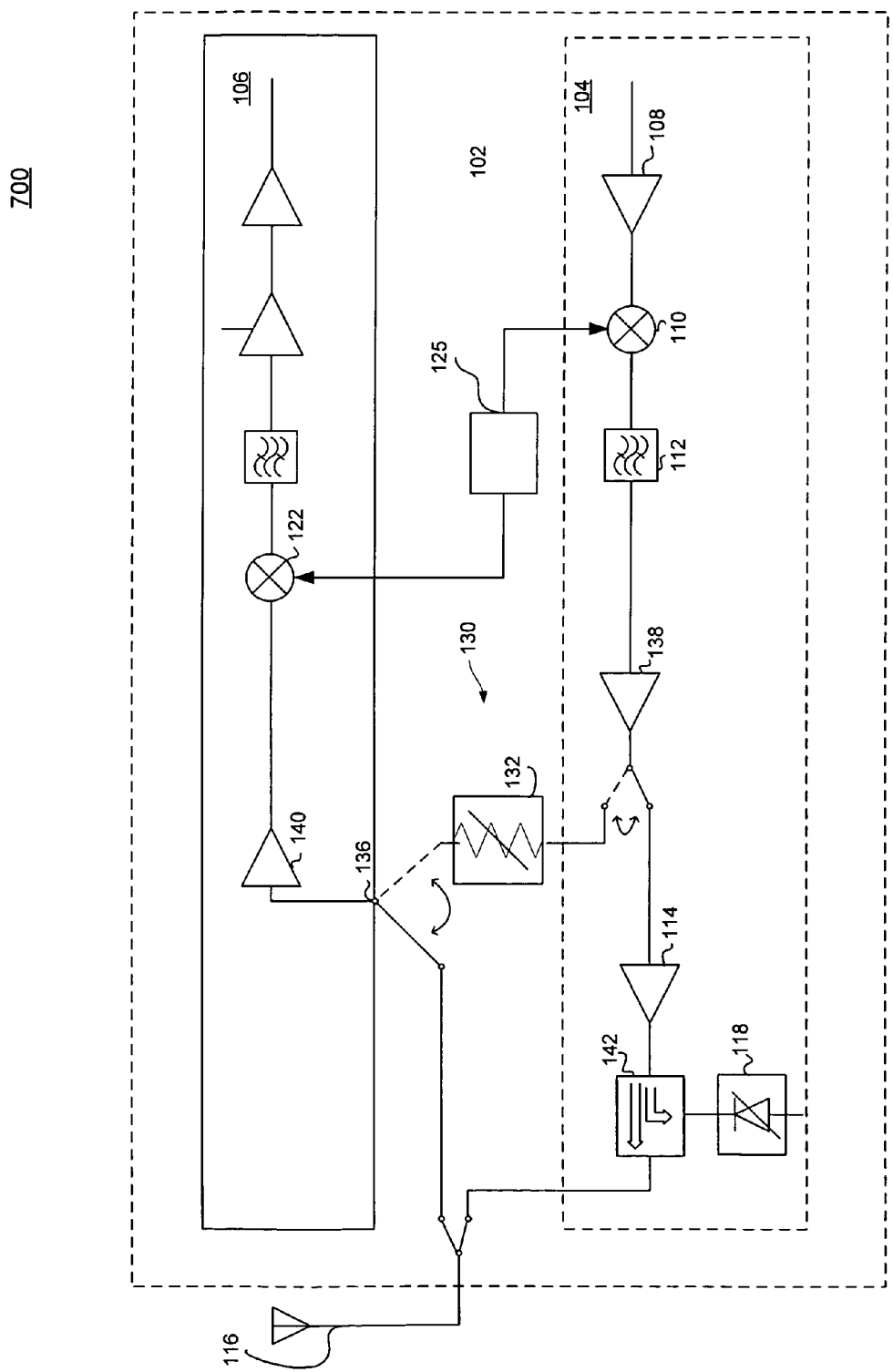
FIG. 7 is a schematic diagram of a transceiver having an on-chip power detection capability and including a loop-back circuit, power detector, and coupler, according to still another embodiment of the present invention.
Figure 8:
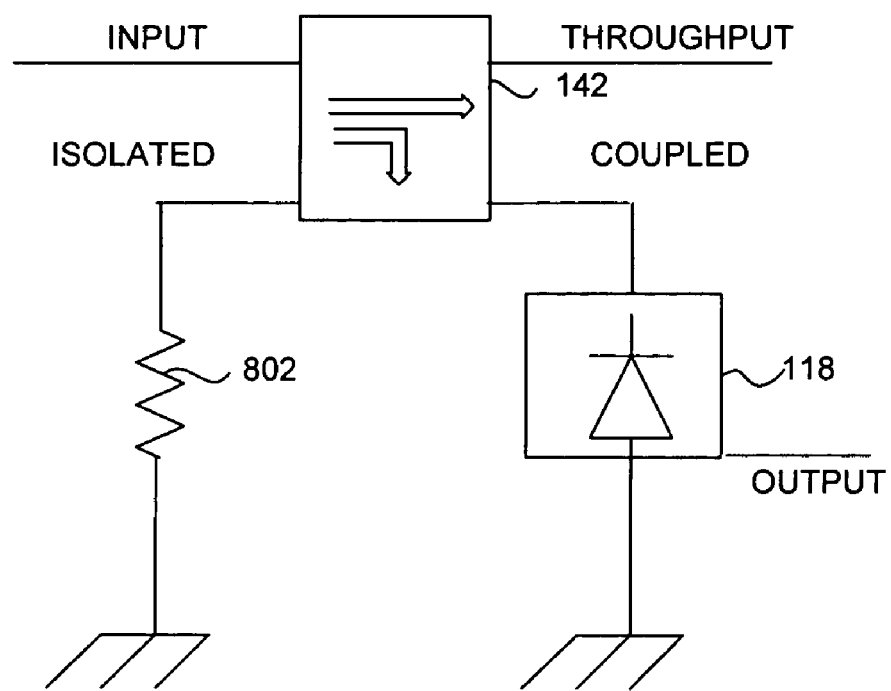
FIG. 8 is a schematic diagram of a power detector and directional coupler for use in a transceiver having an on-chip power detection capability and including a loop-back circuit, according to yet another embodiment of the present invention.

In a preferred embodiment illustrated in FIG. 7, a coupler 142 is interposed between the detector 118 and the high-power amplifier 114 to which the exemplary detector is electrically linked, albeit now through the coupler. Referring additionally to FIG. 8, the directional coupler 142 is a two-port coupler with the terminal of one port connected through a resistor 802 to ground and a terminal of the other port illustratively connected to the detector 118, which is also connected to ground. The directional coupler 142 and detector 118 operate cooperatively to provide noninvasive power monitoring, as will be readily understood by one of ordinary skill in the art. Wherever employed within the transceiver 100, the combination allows the power level of a signal to be monitored without affecting the signal path.

This invention can be embodied in other forms without departing from the spirit or essential attributes thereof. Accordingly, reference should be made to the following claims, rather than to the foregoing specification, as indicating the scope of the invention.

That claimed is:
1. A self-testing transceiver having an on-chip power detection capability, the self-testing transceiver comprising:
a semiconductor substrate;
a transmitter disposed on said substrate and comprising a high-power amplifier;
a receiver disposed on said substrate for selectively coupling to an antenna;
at least one power detector disposed on said semiconductor substrate for determining a power of a signal at an internal node of the self-testing transceiver, the at least one power detector having
an initial-stage attenuator for attenuating a received signal, said initial-stage attenuator having a signal input and a signal output,
a final-stage attenuator electrically connected to said initial-stage attenuator for attenuating the received signal, said final-stage attenuator having a signal input and a signal output,
at least one intermediate-stage attenuator connected in series between said initial-stage attenuator and said final-stage attenuator for also attenuating the received signal,
an initial-stage detection unit connected to said signal input of said initial-stage attenuator for providing a first power measurement, an intermediate-stage detection unit connected to said signal output of said initial-stage attenuator for providing a second power measurement, at least one additional intermediate-stage detection unit connected to said signal input of said final-stage attenuator for providing a third power measurement, a final-stage detection unit connected to said signal output of said final-stage attenuator for providing a fourth power measurement, and a power determining module connected to each of said detection units for determining a power of the received signal based upon the first, second, third, and fourth power measurements; and a loopback circuit disposed on said substrate, said loopback circuit comprising an attenuator, a preamplifier, a first switch for switching said preamplifier between said attenuator and said high-power amplifier, a low-noise amplifier, and a second switch for switching said low-noise amplifier between said attenuator and said antenna;

wherein in a self-testing mode said first switch connects said preamplifier to said attenuator and said second switch connects said attenuator to said low-noise amplifier to thereby provide a signal path for a test signal from said preamplifier to said low-noise amplifier through said attenuator.

2. The self-testing transceiver of claim 1, further comprising a directional coupler interposed between said at least one power detector and said internal node.

3. The self-testing transceiver of claim 1, wherein at least one of said first and second switches comprises an RF/microwave switch.

4. The self-testing transceiver of claim 3, wherein said RF switch comprises one of a CMOS switch, GaAs switch, MEM switch, and PIN-diode switch.

5. The self-testing transceiver of claim 1, wherein said attenuator comprises an RF attenuator.

6. The self-testing transceiver of claim 5, wherein said RF attenuator is a pi-type resistance attenuator.

7. The self-testing transceiver of claim 5, wherein said RF attenuator is a T-type resistance attenuator.

8. The self-testing transceiver of claim 1, wherein the power determining module of the at least one power detector determines said power by selecting one of a ratio of the second power measurement to the first power measurement, a ratio of the third power measurement to the second power measurement, and a ratio of the fourth power measurement to the third power measurement.

9. The self-testing transceiver of claim 1, wherein the power detector further comprises a reference unit connected to each of said detection units for providing a reference voltage.

10. The self-testing transceiver of claim 1, wherein said initial detection unit, intermediate detection unit, at least one additional intermediate detection unit, and final detection unit of the power detector each comprises a bipolar junction transistor (BJT) detection unit that comprises a bipolar junction transistor.

* * * * *